United States Patent
Narazaki et al.

(10) Patent No.: US 8,530,966 B2
(45) Date of Patent: Sep. 10, 2013

(54) SEMICONDUCTOR DEVICE

(75) Inventors: Atsushi Narazaki, Tokyo (JP); Hisaaki Yoshida, Tokyo (JP); Kazuaki Higashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/205,085

(22) Filed: Aug. 8, 2011

(65) Prior Publication Data

US 2012/0153382 A1 Jun. 21, 2012

(30) Foreign Application Priority Data

Dec. 17, 2010 (JP) ................... 2010-281547

(51) Int. Cl.
*H01L 29/76* (2006.01)
*H01L 21/336* (2006.01)

(52) U.S. Cl.
USPC ........... 257/339; 257/330; 257/341; 257/365; 257/E21.384; 257/E21.549; 257/E29.136; 257/E29.201; 438/138; 438/268; 438/270

(58) Field of Classification Search
USPC .......... 257/330, 339, 341, 365, E21.384, 257/E21.549, E29.136, E29.201; 438/138, 438/268, 270
See application file for complete search history.

(56) References Cited

U.S. PATENT DOCUMENTS

| | | | | |
|---|---|---|---|---|
| 6,303,410 B1 * | 10/2001 | Baliga | | 438/138 |
| 6,534,823 B2 * | 3/2003 | Hueting et al. | | 257/330 |
| 8,207,573 B2 * | 6/2012 | Park | | 257/330 |
| 2004/0124464 A1 * | 7/2004 | Narazaki | | 257/339 |
| 2009/0273026 A1 * | 11/2009 | Wilson et al. | | 257/330 |

FOREIGN PATENT DOCUMENTS

| | | |
|---|---|---|
| JP | 2005-322949 | 11/2005 |
| JP | 3904648 | 1/2007 |
| KR | 10-0809332 B1 | 3/2008 |

OTHER PUBLICATIONS

Korean Office Action Issued Feb. 22, 2013 in Patent Application No. 10-2011-0130027 (with partial English translation).

* cited by examiner

*Primary Examiner* — Dao H Nguyen
(74) *Attorney, Agent, or Firm* — Oblon, Spivak, McClelland, Maier & Neustadt, L.L.P.

(57) ABSTRACT

A semiconductor device includes a trench extending from a surface of a P-base layer to a surface of a P-well layer. The trench has a trench end portion defined in the surface of the P-well layer and in a direction in which the trench extends. The trench has first and second regions. The first region extends from the trench end portion to get into the surface of the P-base layer near a boundary between the P-base layer and the P-well layer. The second region extends in the surface of the P-base layer from an end portion of the first region. A trench width is greater in the first region than in the second region.

4 Claims, 9 Drawing Sheets

F I G . 1
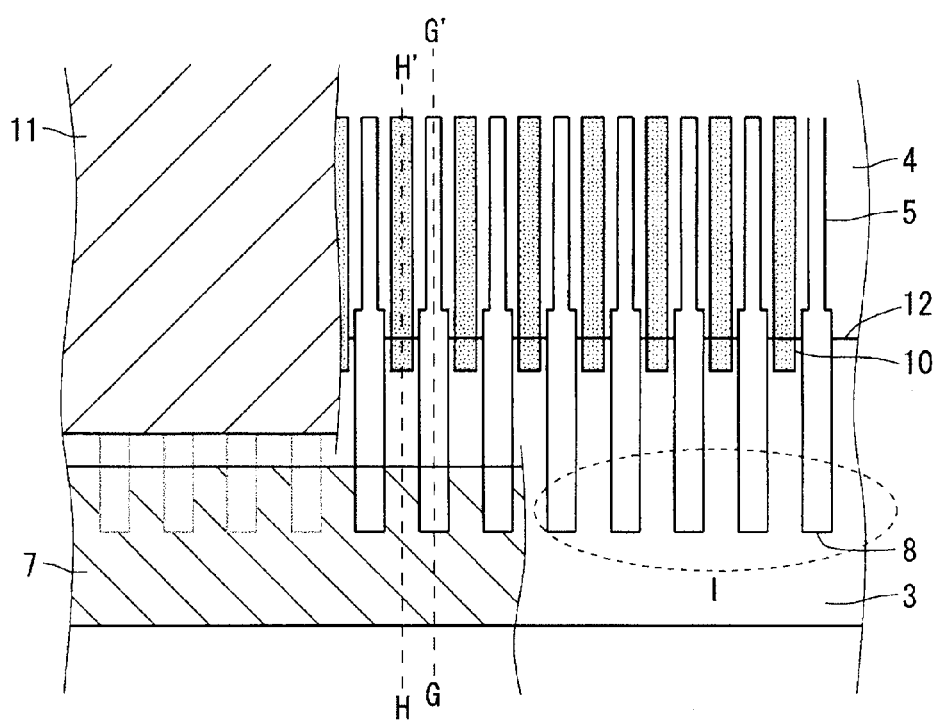

F I G. 4
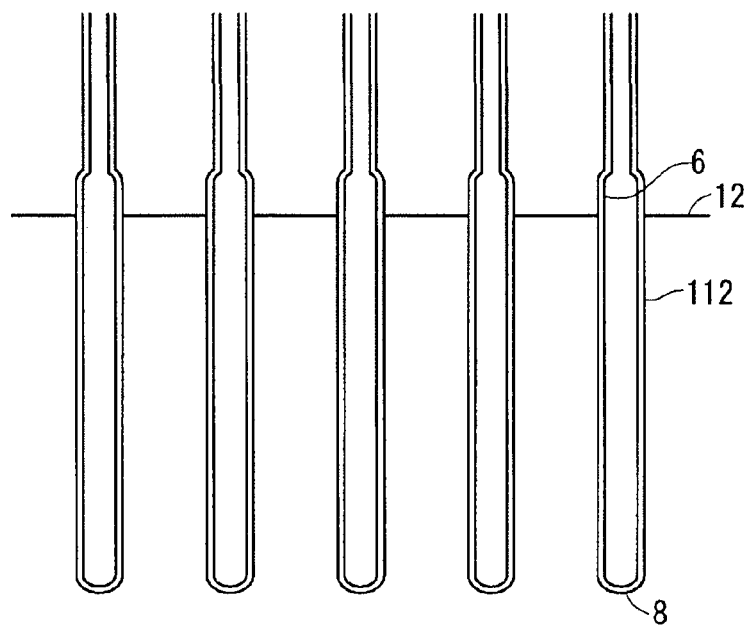
F I G. 5
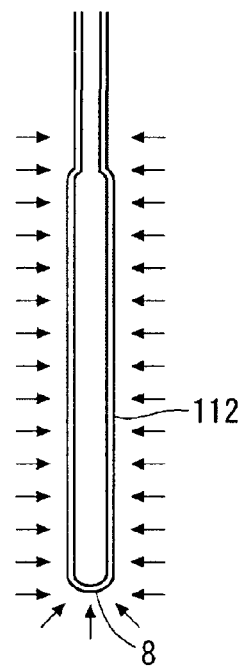

F I G . 1 0
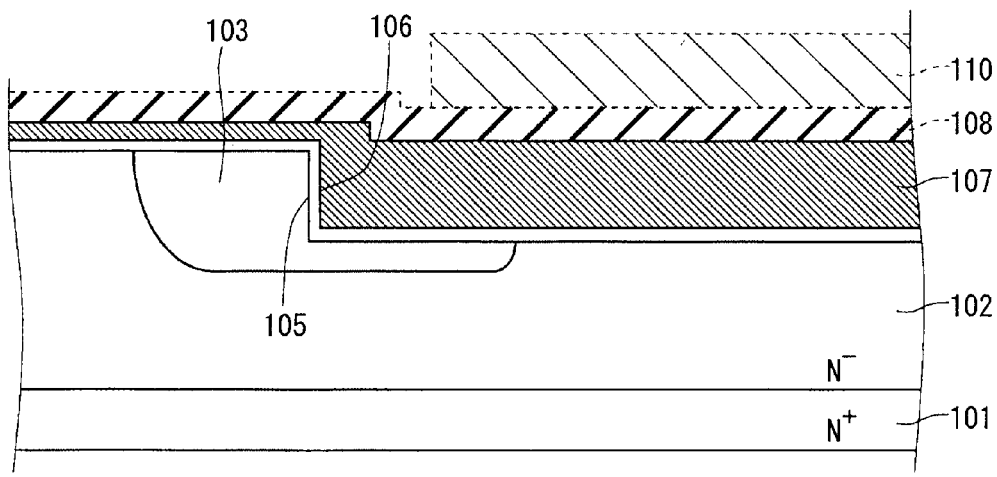
F I G . 1 1
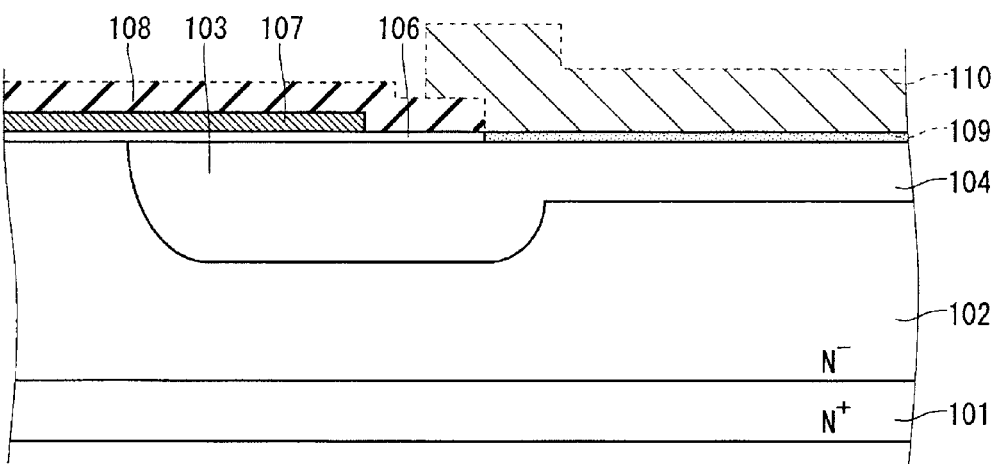

F I G . 1 2
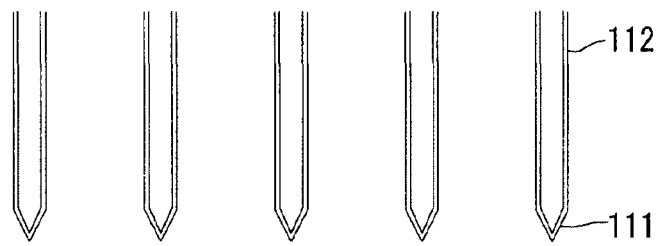
F I G . 1 3
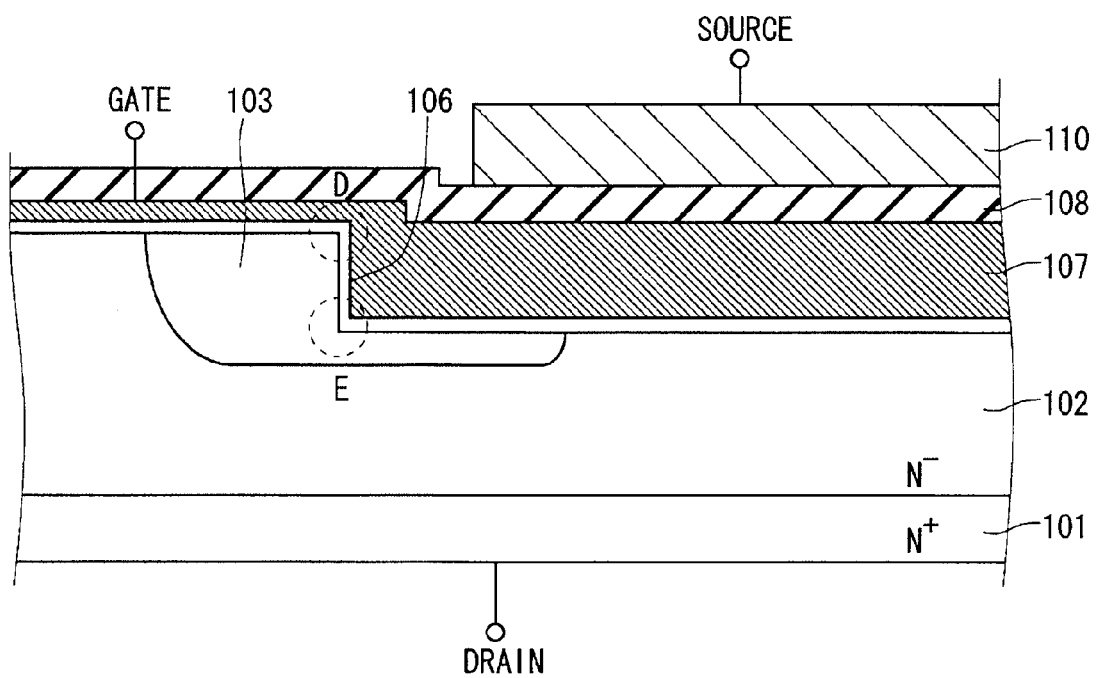

SEMICONDUCTOR DEVICE

BACKGROUND OF THE INVENTION

1. Field of the Invention

The present invention relates to a semiconductor device, and more specifically, to a termination region of a power semiconductor device with a trench gate structure.

2. Description of the Background Art

Power semiconductor devices have been applied as semiconductor devices in inverter circuits and converter circuits for motor control in response to industrial needs. These power semiconductor devices have also been applied frequently in recent years in wind power generation and photovoltaic power generation systems in response to higher awareness of ecological issues.

High-speed switching performance and reduction in on-resistance have been required especially for power MOSFETs applied in power supply circuits and switching power supply circuits.

As a technical trend for reduction in on-resistance of power MOSFETs, patterns have been made finer in wafer processing to increase the density of transistor cells. A trench gate structure has been employed to increase the density of transistor cells (see Japanese Patent No. 3904648).

Reduction in gate capacitance has been required to realize high-speed switching. The opening width of a trench should be made smaller, or a trench should be made shallower for reduction in gate capacitance. Reduction in gate capacitance is also achieved by using stripe trenches in addition to mesh trenches.

A fine processing technique using an excimer stepper has been employed to make a trench pattern finer. Meanwhile, an end portion of a trench becomes sharp pointed with a smaller width of a pattern.

A gate oxide film cannot be made uniform if it is formed in a trench with such a sharp pointed end portion, leading to reduction in dielectric strength.

A strong electric field is applied to the end portion of a trench if a voltage is applied between a source and a drain with a gate and the source short circuited, leading to unstable condition caused for example by oscillation of a breakdown voltage.

SUMMARY OF THE INVENTION

It is an object of the present invention to provide a semiconductor device with a trench gate structure capable of preventing reduction of dielectric strength of a gate oxide film and oscillation of a breakdown voltage by devising the layout and the shape of a trench end portion.

A semiconductor device of the present invention includes a drift-layer of a first conductivity type formed on a semiconductor substrate of the first conductivity type, a base layer of a second conductivity type formed selectively in a surface of the drift layer, a well layer of the second conductivity type formed in the surface of the drift layer, the well layer being adjacent to the base layer, a trench extending from a surface of the base layer to a surface of the well layer, the trench having a trench end portion defined in the surface of the well layer and in a direction in which the trench extends, and a gate electrode formed selectively on the drift layer in which the trench is formed. The trench has first and second regions. The first region extends from the trench end portion to get into the surface of the base layer near a boundary between the base layer and the well layer. The second region extends in the surface of the base layer from an end portion of the first region. A trench width is greater in the first region than in the second region.

The semiconductor device of the present invention prevents the trench end portion from becoming sharp pointed, thereby preventing reduction of dielectric strength of a gate oxide film and oscillation of a breakdown voltage.

These and other objects, features, aspects and advantages of the present invention will become more apparent from the following detailed description of the present invention when taken in conjunction with the accompanying drawings.

DESCRIPTION OF THE PREFERRED EMBODIMENTS

Brief Description of the Drawings

FIG. 1 is a top view of a semiconductor device of a first preferred embodiment;

FIG. 4 shows a region I of FIG. 1 in an enlarged manner in the semiconductor device of the first preferred embodiment;

FIG. 5 shows the strength of an electric field applied to a trench end portion in the semiconductor device of the first preferred embodiment;

FIG. 10 is a sectional view taken along a line A-A' of FIG. 9 in the semiconductor device of the prerequisite technique;

FIG. 11 is a sectional view taken along a line B-B' of FIG. 9 in the semiconductor device of the prerequisite technique;

FIG. 12 shows a region C of FIG. 9 in an enlarged manner in the semiconductor device of the prerequisite technique;

FIG. 13 shows the semiconductor device of the prerequisite technique in which electrode terminals are added;

EMBODIMENT FOR CARRYING OUT THE INVENTION

A. First Preferred Embodiment

Figure 9:
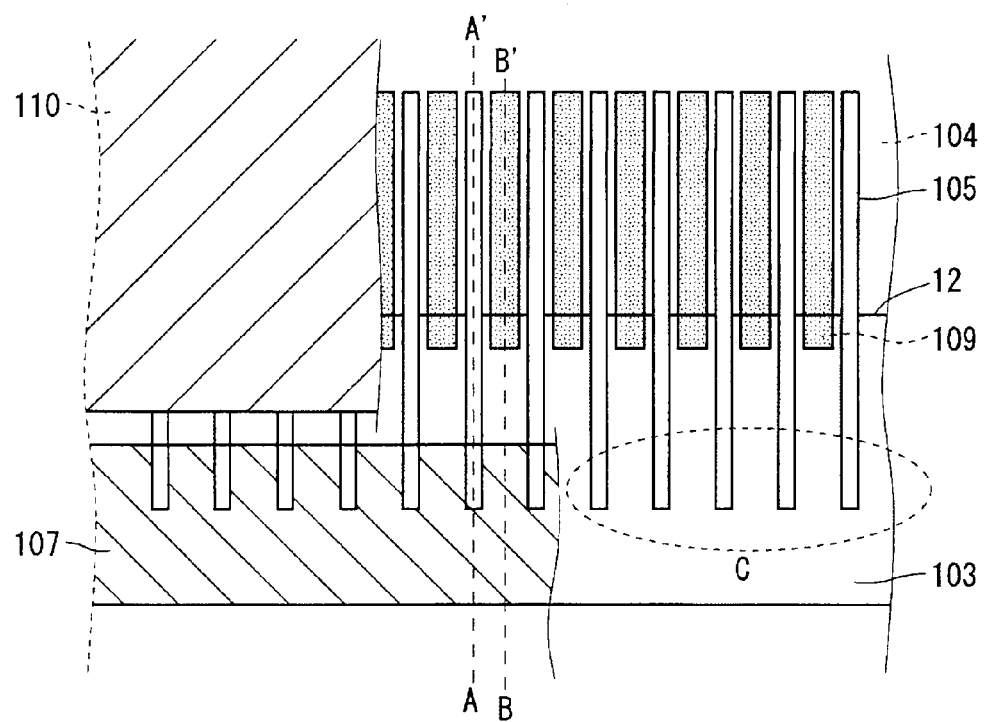
FIG. 9 is a top view of a semiconductor device of a prerequisite technique.

FIG. 9 is a top view of a trench termination region in a power MOSFET with a trench gate structure according to a prerequisite technique to the present invention. For the convenience of illustration, a gate electrode 107 and a source electrode 110 are shown in part, and an N+-source region is not shown.

As shown in FIG. 9, a plurality of trenches 105 is arranged both in a P-well layer 103 and a P-base layer 104. A plurality of source contacts 109 is formed between the trenches 105 to cover both the P-well layer 103 and the P-base layer 104 (namely, to straddle a P-well stepped part 12).

The gate electrode 107 is formed to cover the P-well layer 103 and the trenches 105. The source electrode 110 is formed to cover the P-base layer 104, the source contacts 109, part of the P-well layer 103, and parts of the trenches 105.

FIG. 10 is a sectional view of a trench region taken along a line A-A' of FIG. 9, and FIG. 11 is a sectional view of a silicon mesa region taken along a line B-B' of FIG. 9.

As shown in FIG. 11 (sectional view taken along the line B-B'), the P-well layer 103 and the P-base layer 104 are arranged adjacent to each other in a surface of a low-concentration N-type drift layer 102 formed on a high-concentration N-type substrate 101. As shown in FIG. 10 (sectional view taken along the line A-A'), the trench 105 extends from a region in which the P-base layer 104 is formed to a region in which the P-well layer 103 is formed. The trench 105 has a trench end portion 111 formed in the P-well layer 103 and which is a termination structure defined in a direction in which the trench 105 extends.

A gate oxide film 106 is formed on the inner wall of the trench 105. The gate electrode 107 made of polysilicon containing highly-doped phosphorous is formed inside the gate oxide film 106.

As shown in FIGS. 10 and 11, an interlayer insulating film 108 is further formed to cover the entire main surface. Further, the source contact 109 is selectively formed to cover both the P-well layer 103 and the P-base layer 104 in the silicon mesa region (see FIG. 11).

The source electrode 110 made of aluminum or aluminum silicon and connected to the source contact 109 is further formed in an upper layer.

FIG. 12 is a top view of a region C in which the trench end portions 111 are shown in an enlarged manner. If a fine trench pattern having a trench width for example of 0.25 μm or smaller is employed, the resolution of the trench end portions 111 during photolithography is reduced. Also, the trench pattern becomes acute, so the trench end portions 111 become sharp pointed.

As a result, the gate oxide film 106 becomes thinner at the trench end portions 111 than at trench flat portions 112.

FIG. 13 is a sectional view showing gate, source, and drain terminals added to the fine trench pattern of FIG. 10. A region D corresponds to a gate pickup part of the trench end portion 111 of FIG. 12. A region E corresponds to a trench bottom part of the trench end portion 111. As shown in FIG. 13, formation of the fine trench pattern makes the gate oxide film 106 thin in a range between the regions D and E.

In order to measure gate dielectric strength, a voltage (Vg) is applied between a gate and a source with the source and a drain short circuited, and a resultant current (Ig) is measured. In order to measure a breakdown voltage between the drain and the source, a voltage (Vd) is applied to the drain with the gate and the source short circuited, and a resultant drain current (Id) is measured. This drain current is also called a leakage current.

Figure 14:
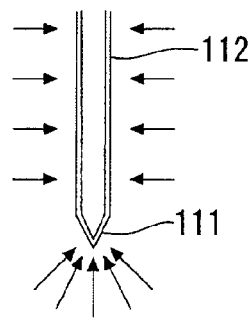
FIG. 14 shows the strength of an electric field applied to a trench end portion in the semiconductor device of the prerequisite technique.

FIG. 14 shows the strength of an electric field applied to the trench end portion 111 when a gate dielectric strength is measured. As shown in FIG. 14, electric fields from many directions concentrate in the trench end portion 111. So, the trench end portion 111 is exposed to a stronger electric field than the trench flat portion 112.

Figure 15:
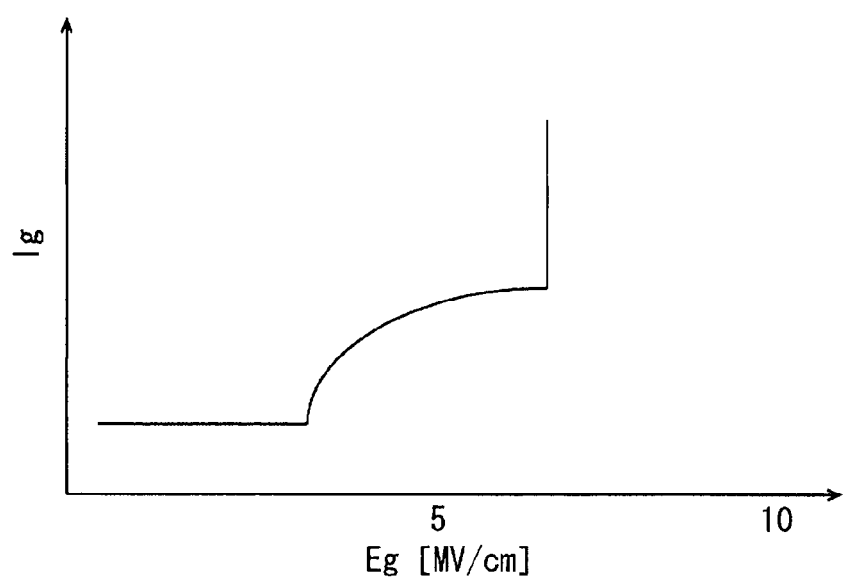
FIG. 15 shows the waveform of a gate leakage current in the semiconductor device of the prerequisite technique.

As a result, a leakage current increases when an electric field applied to the gate becomes greater than a level around 3 MV/cm as shown in FIG. 15. FIG. 15 shows a relationship between an electric field applied and a leakage current, with the horizontal axis representing an electric field [MV/cm] applied to the gate and the vertical axis representing a leakage current [A].

Figure 16:
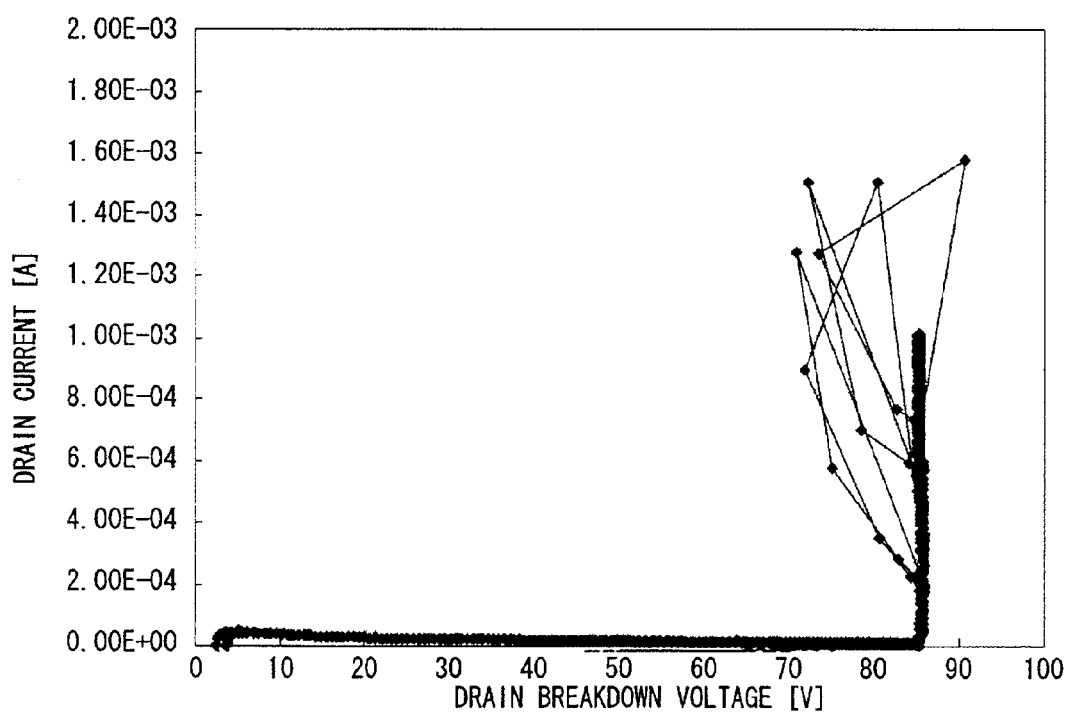
FIG. 16 shows the waveform of a drain breakdown voltage in the semiconductor device of the prerequisite technique.

It has also been found that a strong electric field applied to the trench end portion 111 during measurement of a breakdown voltage between the drain and the source generates oscillation of the breakdown voltage. FIG. 16 shows the AC half-wave waveform of a breakdown voltage measured in an MOSFET chip with a drain breakdown voltage of 86 V. The waveform of FIG. 16 is made unstable due to oscillation of an avalanche breakdown current. In FIG. 16, the horizontal axis represents a drain breakdown voltage [V], and the vertical axis represents a drain current [A].

A semiconductor device capable of solving the aforementioned problems is described in a preferred embodiment given below.

<A-1. Structure>

FIG. 1 is a top view of a trench termination region in a power MOSFET with a trench gate structure that is a semiconductor device of the present invention. For the convenience of illustration, a gate electrode 7 and a source electrode 11 are shown in part, and an N⁺-source region is not shown.

As shown in FIG. 1, a plurality of trenches 5 is arranged both in a P-well layer 3 and a P-base layer 4. A plurality of source contacts 10 is formed between the trenches 5 to cover both the P-well layer 3 and the P-base layer 4 (namely, to straddle a P-well stepped part 12).

The gate electrode 7 is formed to cover the P-well layer 3 and the trenches 5. The source electrode 11 is formed to cover the P-base layer 4, the source contacts 10, part of the P-well layer 3, and parts of the trenches 5.

Figure 2:
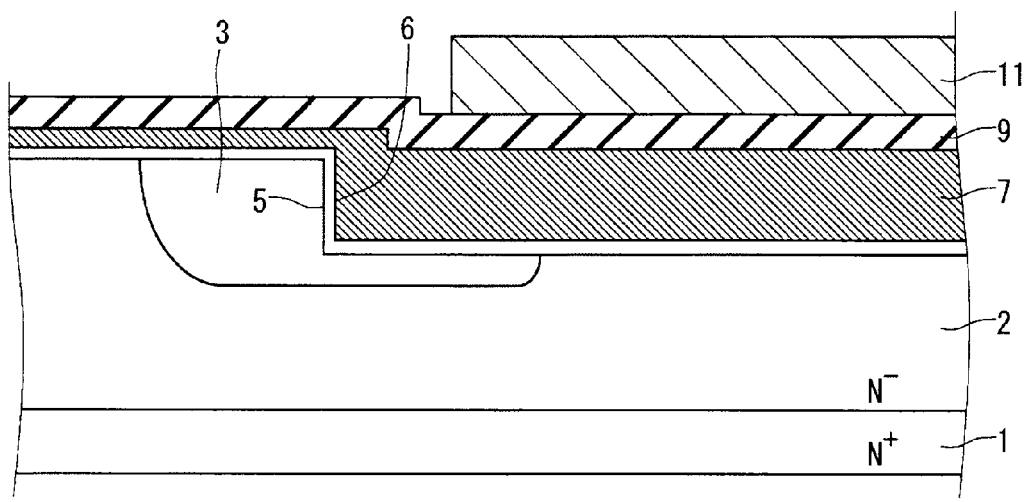
FIG. 2 is a sectional view taken along a line G-G' of FIG. 1 in the semiconductor device of the first preferred embodiment.
Figure 3:
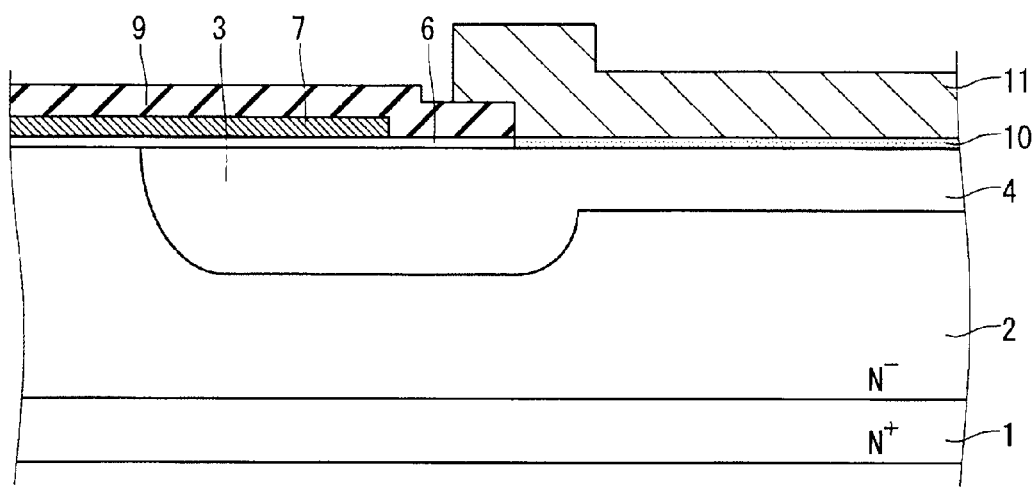
FIG. 3 is a sectional view taken along a line H-H' of FIG. 1 in the semiconductor device of the first preferred embodiment.

FIG. 2 is a sectional view of a trench region taken along a line G-G' of FIG. 1, and FIG. 3 is a sectional view of a silicon mesa region taken along a line H-H' of FIG. 1.

As shown in FIG. 3 (sectional view taken along the line H-H'), the P-well layer 3 and the P-base layer 4 both of a second conductivity type are selectively arranged adjacent to each other in a surface of a low-concentration N-type drift layer 2 (drift layer of a first conductivity type) formed on a high-concentration N-type substrate 1 as a semiconductor substrate of the first conductivity type. As shown in FIG. 2 (sectional view taken along the line G-G'), the trench 5 extends from a region in which the P-base layer 4 is formed to a region in which the P-well layer 3 is formed. The trench 5 has a trench end portion 8 formed in the P-well layer 3 and which is a termination structure defined in a direction in which the trench 5 extends.

A gate oxide film 6 is formed on the inner wall of the trench 5. The gate electrode 7 made of polysilicon containing highly-doped phosphorous is formed inside the gate oxide film 6. The gate electrode 7 is formed selectively on the N-type drift layer 2 in which the trench 5 is formed.

An interlayer insulating film 9 is further formed to cover the entire main surface (FIGS. 2 and 3). Further, the source contact 10 is selectively formed to cover both the P-well layer 3 and the P-base layer 4 in the silicon mesa region (FIG. 3).

The source electrode 11 made of aluminum or aluminum silicon and connected to the source contact 10 is further formed in an upper layer.

A trench width is oversized in the trench end portion 8 compared to the remaining part of the trench 5. The oversized trench end portion 8 (first region) extends to get into a surface of the P-base layer 4 near a P-well stepped part 12 defined at a boundary between the P-well layer 3 and the P-base layer 4. To be specific, a boundary between the oversized trench end portion 8 (first region) and a trench flat portion 112 (second region) that is not oversized is defined closer to the P-base layer 4 than the P-well stepped part 12 at the boundary between the P-well layer 3 and the P-base layer 4. Over-sizing mentioned here means increase of the size of a particular part from a given size. In the present invention, over-sizing means increase of a trench width.

FIG. 4 is a top view of a region I (see FIG. 1) in which the trench end portions 8 are shown in an enlarged manner. The oversized trench end portions 8 do not become sharp pointed, so that the gate oxide film 6 on the trench inner walls is formed uniformly in the trench flat portions 112 and in the trench end portions 8.

The oversized region (first region) reaches as far as the P-base layer 4 through the P-well layer 3 and the P-well stepped part 12. This suppresses reduction in margin of trench photolithography due to level differences of silicon generated during formation of the P-well layer 3.

Regarding the opening width of the trench 5, an electric field at the trench end portion 8 can be relaxed in the fine trench 5 if the present invention is applied to a semiconductor device in which a trench width X of a part not oversized (second region) does not exceed 0.25 μm. Further, reduction in margin of trench photolithograph due to the P-well stepped part 12 generated during formation of the P-well layer 3 can be suppressed further if a trench width Y of an oversized part (first region) is determined to be 0.35 μm or more. These trench widths are given merely as examples, and they are not intended to limit the trench width of the present invention.

<A-2. Operation>

In order to measure gate dielectric strength, a voltage (Vg) is applied between a gate and a source with the source and a drain short circuited, and a resultant current (Ig) is measured. In order to measure a breakdown voltage between the drain and the source, a voltage (Vd) is applied to the drain with the gate and the source short circuited, and a resultant drain current (Id) is measured. This drain current is also called a leakage current.

FIG. 5 shows the strength of an electric field applied to the trench end portion 8 in the semiconductor device of the present invention when a gate dielectric strength is measured. As seen from FIG. 5, electric fields do not concentrate in the trench end portion 8 of the semiconductor device of the present invention, but the electric field of the same strength is applied to the trench end portion 8 and to the trench flat portion 112.

Figure 6:
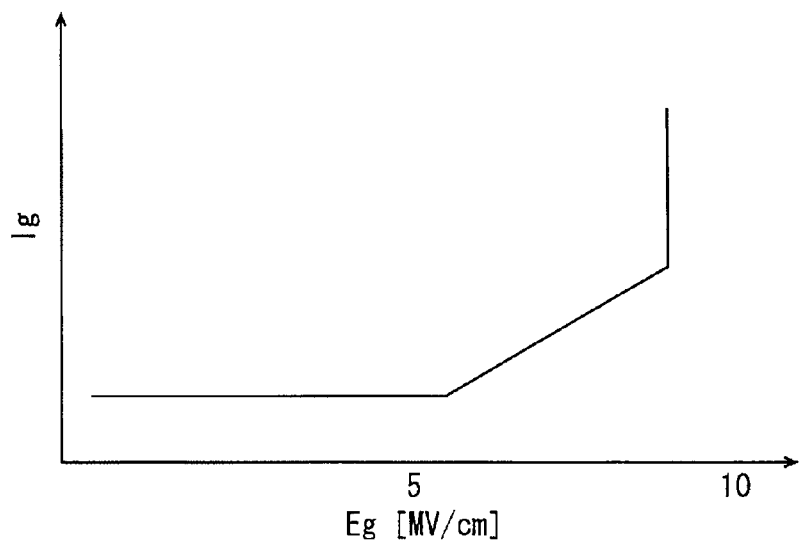
FIG. 6 shows the waveform of a gate leakage current in the semiconductor device of the first preferred embodiment.

As a result, substantially no leakage current is generated until an electric field applied to the gate becomes greater than a level around 5 MV/cm as shown in FIG. 6, meaning that gate dielectric strength is increased. FIG. 6 shows a relationship between an electric field applied and a leakage current, with the horizontal axis representing an electric field [MV/cm] applied to the gate and the vertical axis representing a leakage current [A].

Figure 7:
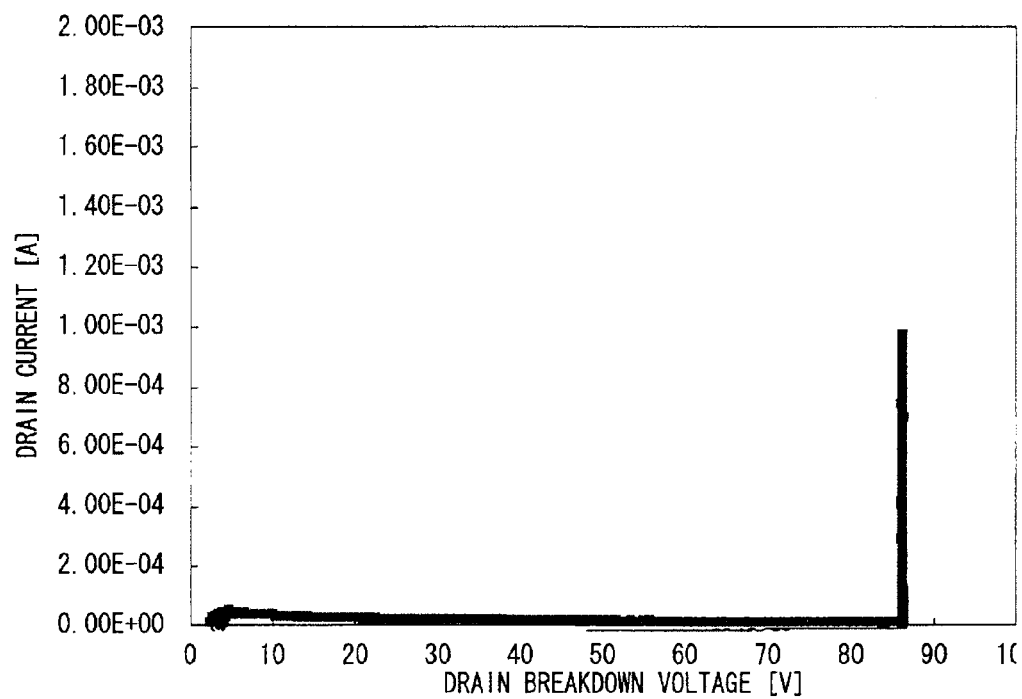
FIG. 7 shows the waveform of a drain breakdown voltage in the semiconductor device of the first preferred embodiment.
Figure 8:
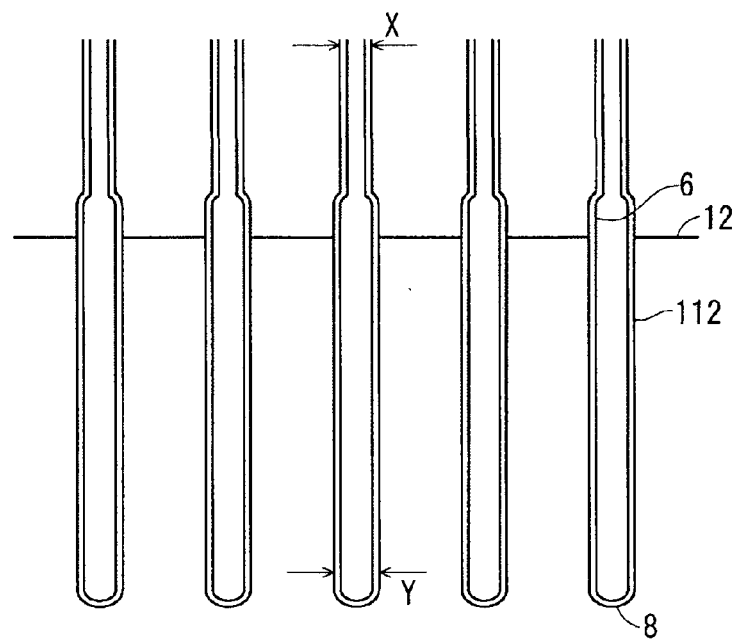
FIG. 8 is a top view of a trench termination region in the semiconductor device of the first preferred embodiment.

Electric field relaxation at the trench end portion 8 makes a normal waveform of a breakdown voltage without generating leakage current or oscillation when a breakdown voltage between the drain and the source is measured. FIG. 7 shows the AC half-wave waveform of a breakdown voltage measured in an MOSFET chip with a drain breakdown voltage of 86 V. As shown in FIG. 7, a normal waveform of a breakdown voltage is obtained. In FIG. 7, the horizontal axis represents a drain breakdown voltage [V], and the vertical axis represents a drain current [A].

In the preferred embodiment, the present invention is applied to a power MOSFET using a silicon material as an example. Meanwhile, the present invention achieves the same effect if it is applied to a device using a wide band gap semiconductor (such as silicon carbide) that has been developed further in recent years and which is expected to achieve high efficiency.

In the preferred embodiment described above, a power MOSFET is given as an example of the semiconductor device. Meanwhile, the present invention achieves the same effect in different semiconductor devices such as an IGBT.

<A-3. Effects>

In the first preferred embodiment of the present invention, the semiconductor device includes the trench 5 extending from a surface of the P-base layer 4 to a surface of the P-well layer 3. The trench 5 has the trench end portion 8 defined in the surface of the P-well layer 3 and in a direction in which the trench 5 extends. The trench 5 has the first and second regions. The first region extends from the trench end portion 8 to get into the surface of the P-base layer 4 near the boundary between the P-base layer 4 and the P-well layer 3. The second region extends in the surface of the P-base layer 4 from an end portion of the first region. A trench width is greater in the first region than in the second region. So, the trench end portion 8 does not become sharp pointed, thereby preventing reduction of dielectric strength of a gate oxide film and oscillation of a breakdown voltage.

Extension of the oversized first region to the boundary between the P-well layer 3 and the P-base layer 4 suppresses bad resolution during photolithography to be caused by formation of a stepped region at the boundary between the P-well layer 3 and the P-base layer 4.

In the semiconductor device of the first preferred embodiment of the present invention, a trench width is set to be 0.25 μm or smaller in the second region. This allows formation of a fine trench pattern to realize size reduction of the device. The shape becomes more acute with a finer pattern. This prevents failure of a breakdown voltage to be caused by connection of the trench end portion 8 while enhancing the dielectric breakdown strength of the gate.

In the semiconductor device of the first preferred embodiment of the present invention, a trench width is set to be 0.35 μm or more in the first region. This prevents the trench end portion 8 from becoming sharp pointed.

Further, formation of a stepped region at the boundary between the P-well layer 3 and the P-base layer 4 will not worsen resolution during photolithography.

In the semiconductor device of the first preferred embodiment of the present invention, the high-concentration N-type substrate 1 as a semiconductor substrate is made of a wide band gap semiconductor, so that the semiconductor device achieves higher efficiency.

The properties and materials of the constituent elements, conditions for carrying out the present invention, and others are not limited to those of the preferred embodiment of the present invention that are given merely as examples.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   a drift layer of a first conductivity type formed on a semiconductor substrate of the first conductivity type;
   a base layer of a second conductivity type formed selectively in a surface of said drift layer;
   a well layer of the second conductivity type formed in the surface of said drift layer, the well layer being adjacent to said base layer;

a trench extending from a surface of said base layer to a surface of said well layer, the trench having a trench end portion defined in the surface of said well layer and in a direction in which the trench extends; and a gate electrode formed selectively on said drift layer in which said trench is formed, wherein said trench has first and second regions, the first region extending from said trench end portion to get into the surface of said base layer near a boundary between said base layer and said well layer, the second region extending in the surface of said base layer from an end portion of said first region, and a trench width is greater in said first region than in said second region.

2. The semiconductor device according to claim 1, wherein the trench width is 0.25 μm or smaller in said second region.

3. The semiconductor device according to claim 1, wherein the trench width is 0.35 μm or more in said first region.

4. The semiconductor device according to claim 1, wherein said semiconductor substrate is made of a wide band gap semiconductor.

* * * * *